April 25, 1961 D. T. KELLEY ET AL 2,981,875

SEMICONDUCTOR DEVICE AND METHOD OF MAKING THE SAME

Filed Oct. 7, 1957

INVENTORS.
Dale T. Kelley and
Robert G. Peterson

Mueller & Aichele
Attys

United States Patent Office 2,981,875

Patented Apr. 25, 1961

2,981,875

SEMICONDUCTOR DEVICE AND METHOD OF MAKING THE SAME

Dale T. Kelley and Robert G. Peterson, Phoenix, Ariz., assignors to Motorola, Inc., Chicago, Ill., a corporation of Illinois Filed Oct. 7, 1957, Ser. No. 688,451

8 Claims. (Cl. 317—235)

This invention relates to semiconductor devices and more particularly to an alloy junction transistor of improved design which is suitable for medium power audio amplification and which, because of its improved design, has improved operating characteristics particularly in the effectiveness in the dissipation of heat generated during its operation. It has a sturdy construction to withstand substantial shock or impact and at the same time is capable of relatively easy and inexpensive assembly. The invention also relates to a method for speedy and accurate assembly of the devices.

In an alloy junction transistor, a semiconductor die or wafer is attached to suitable leads to form base, collector and emitter connections and the die is then enclosed in a suitable container to protect it from air, dust or moisture. The power handling capabilities of an alloy junction transistor are limited by excessive internal heating which heating produces distortion of the signals translated by the unit. It is necessary, therefore, to provide some means for holding the temperature of the semiconductor die to a certain maximum in the power range in which the unit is to be operated. This has been done by providing a liquid heat transfer medium to surround the die and fill up the space between it and the container. Also, the mounting base in which the leads are held is so constructed as to be a good heat sink.

Alloy junction transistors which are used as power transistors are often provided with internal heat dissipating member in the form of metallic straps serving as electrode connectors. It is desirable to make such members with a maximum heat dissipating area but without unduly increasing the overall size of the transistor.

A serious problem in transistor manufacture is that of salvaging units which do not meet electrical specifications upon testing. In transistors having a mounting base for holding the leads and a semiconductor die unit secured to the leads held by mounting base, the mounting base is often the most expensive part of the entire transistor unit. In transistor manufacture, electrical testing of the transistor assembly occurs after the semiconductor die unit is connected to the mounting base through the leads and prior to affixing a cover to the unit. In almost all instances, failure to pass electrical specifications upon testing is due to some defect in the less expensive semiconductor die unit. Such failure usually results in the rejection of the entire unit including the more expensive mounting base which of itself is usually perfectly satisfactory. This is because most transistors are so designed that the defective semiconductor die unit cannot easily be detached from the mounting base in such a way that the mounting base may be reused with a satisfactory semiconductor die unit.

It is an object of the present invention to provide an improved semiconductor device having effective means for dissipating the internal heat generated by its operation and with such means arranged to provide a relatively large heat transfer area within a relatively small volume.

It is another object of the invention to provide an improved transistor which is capable of relatively easy and inexpensive assembly.

It is another object of the invention to provide a transistor including a mounting base member and a semiconductor die unit connected thereto of such a structure that the semiconductor die unit may be relatively easily detached from the mounting base if the semiconductor die unit is electrically defective and the mounting base may subsequently be reused with another die unit.

Still another object of the invention is to provide a relatively quick and inexpensive method for assembling diminutive transistors.

A feature of the invention is the provision of a pair of folded-over conductive straps of good heat transfer characteristics connected to the leads of the transistor and in turn connecting these leads to the semiconductor die through electrical contacts on the surface of the wafer. Electrical connection between the contacts and the straps is made through projection formed in the surface of each strap. These straps provide a relatively large surface area and thus are effective in dissipating the heat generated by the operation of the device but they do not occupy so great a volume as to necessitate an increase in the overall size of the unit.

Another feature of the invention is the provision of a transistor including a flat semiconductor die with electrodes carried on opposite surfaces thereof and which is held between a pair of folded conductive straps to which the electrodes are fused. A straight tab portion is connected to the die which tab can be connected to the base lead of the transistor in a variety of positions with the electrodes being aligned for connection to the straps in each of the positions thus facilitating the reuse of mounting bases from rejected units. The base lead is of sufficient length to permit its being clipped off below the point at which it is connected to a defective die unit and subsequently reused. Initially, the base lead is of sufficient length to permit at least two successive shortenings and reattachments.

Another feature of the invention is an improved method of assembling a transistor by securing an M-shaped conductive clip member between the emitter and collector leads which strap is later cut into two electrically separated portions which provide a pair of properly aligned strap members for making connection between the collector and emitter leads and the electrodes carried on opposite faces of its die.

Referring now to the drawings.

Figures 1, 2, 3, 4, 5, 6, 7, 8, 9, 10:
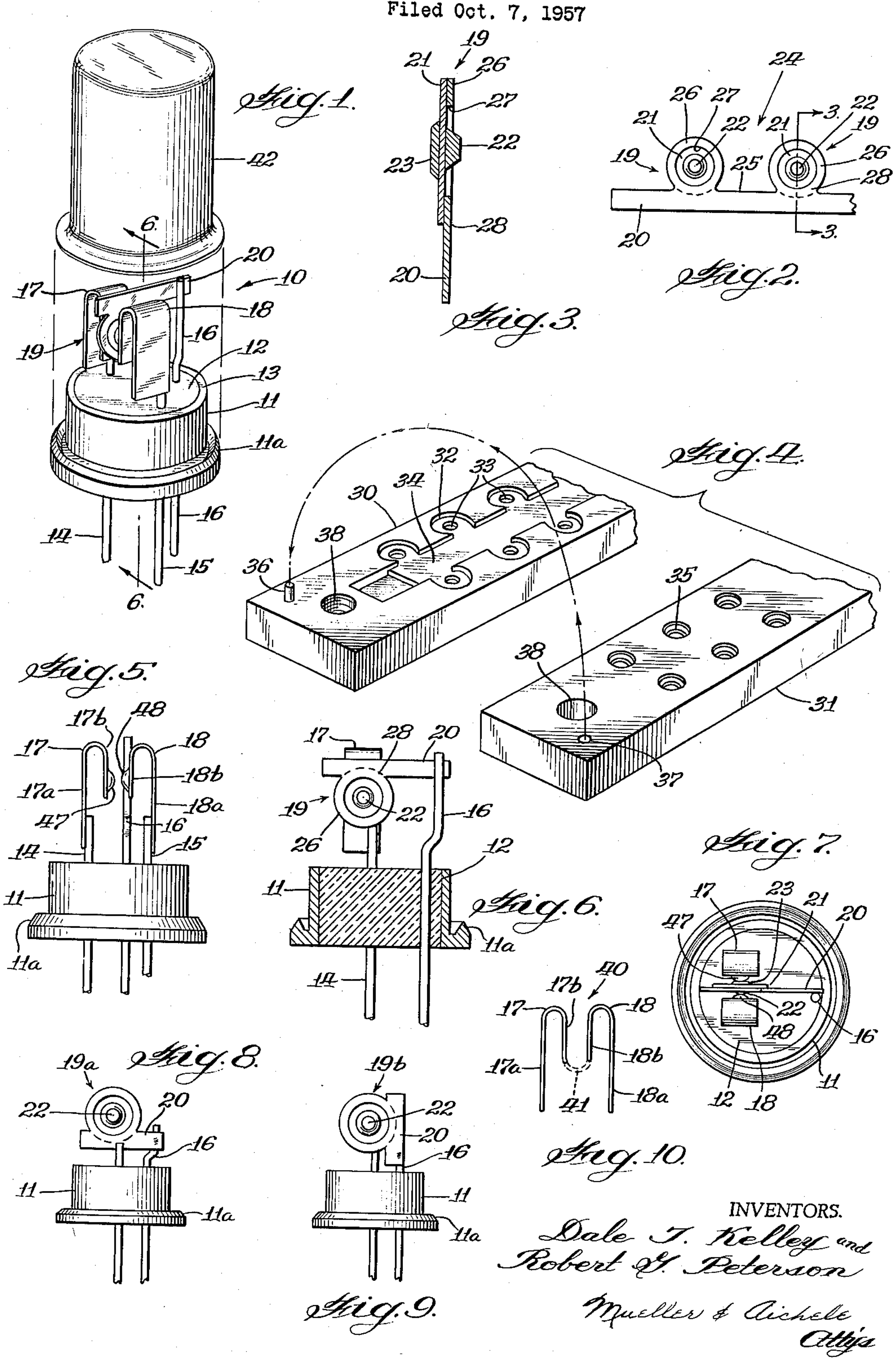
Fig. 1 is an exploded perspective view of the transistor of the present invention.
Fig. 2 is a view showing a series of semiconductor dice carrying electrodes attached to a base connector tab strip.
Fig. 3 is a view in section taken on the line 3—3 of Fig. 2.
Fig. 4 is a perspective view of a suitable boat or jig for holding semiconductor die units during their fabrication.
Fig. 5 is a side elevation view of a partially assembled transistor unit showing a mounting base and a pair of folded conductive straps secured to the emitter and collector leads.
Fig. 6 is a view in section taken on the line 6—6 of Fig. 1.
Fig. 7 is a top view of the unit illustrated in Fig. 1 with the cover member removed.
Figs. 8 and 9 are views in side elevation of partially assembled transistor units showing alternate positions for mounting the semiconductor die unit.
Fig. 10 is a side elevation view of an M-shaped conductive clip from which folded conductive straps are formed by severing the connecting web portion of the clip after the outer legs of the clip have been secured to the leads.

In accordance with one embodiment of the present invention, a power transistor includes a pair of aligned folded strap members serving as heat dissipating means for a semiconductor die unit held between them. The electrodes on opposite faces of the semiconductor die are secured to projections formed on the straps thereby establishing electrical connection and heat exchange relation between the electrodes and the straps. Each strap is electrically connected to an electrode lead held in a round mounting base along with a base lead which is electrically connected to the semiconductor die by a tab connector connected in turn to the die and welded to the base lead. In addition to providing electrical connection, the tab is made relatively wide and serves as a heat dissipating member. The straps are made of a heat conducting metal and because they are relatively broad and folded over they provide a relatively large heat dissipating surface while occupying a relatively small volume. The semiconductor die unit including the semiconductor die and the tab connector extending from it is capable of being secured to the base lead in alternate positions, as will be explained subsequently, so that if the die unit proves defective the base lead is shortened and another die unit reattached with the tab in a different position thus permitting reuse of the mounting base. The base lead is initially somewhat longer than the electrode leads so that it can be shortened if necessary.

In assembling the device, a pair of folded conductive straps are aligned opposite one another with the outer leg of each strap secured to an electrode lead. The semiconductor die unit is then positioned between the inner legs of the conductive straps and suitable projections formed on the surfaces of the inner legs are secured to the electrodes on the die surface by fusion. The tab of the semiconductor die unit is secured to the base lead by welding. The semiconductor die unit may be secured to the lead and the straps while it is integral with a number of other die units which have been fabricated together as a subassembly and then severed from the subassembly. In the event the semiconductor die unit is electrically defective it can be removed without disconnecting the straps from the electrode leads by scraping the electrodes from the straps and pulling back the inner legs of the straps. The end of the base lead is clipped off below the weld to the tab. Another die unit can then be inserted with the tab in a different position and, because of the configuration of the unit, the electrodes can be aligned with projections from the inner legs of the straps even though the tab is in a different position.

Referring now particularly to the drawings, a transistor generally indicated by 10 in Fig. 1 includes the mounting base 11 which in turn includes the insulating disc 12 preferably made of glass or an insulating ceramic material and the metallic ring 13 surrounding the disc 12. Upright, rigid conductive leads 14, 15 and 16 are firmly held within the glass disc 12 and extends through both sides of it. Lead 14 is the collector lead, lead 15 the emitter lead and lead 16 the base lead which is initially longer than the other leads. Conductive straps 17 and 18 are secured to leads 14 and 15 respectively and are made of conductive metal having good heat transfer properties such as silver. Each of the straps 17 and 18 is folded to form two parallel legs **17*a* and 17*b* and 18*a* and 18*b* respectively. Projection 47 extends from the surface of inner leg 17*b* and is aligned opposite projection 48 which extends from the surface of inner leg 18*b***.

The semiconductor die unit 19 is electrically connected in the inner legs **17*b* and 18*b* through projections 47 and 48 respectively which are secured to electrodes forming part of the die unit. The die unit includes a base connector tab 20 secured to the base lead 16 and forming a base connection with the die. The structure of semiconductor die unit 19** is more clearly shown in some other figures including Fig. 3 and will be subsequently described in more detail.

In its completed form the transistor 10 includes the cover member 42 which is made of a heat conducting metal such as mild steel or a nickel-silver alloy and which is welded to the shoulder portion **11*a* of the base member 11**.

As shown particularly in Fig. 3, the semiconductor die unit 19 includes a round flat die 21 which, in accordance with a specific embodiment of the invention is of N-type germanium. The die unit also includes electrical contacts in the form of emitter electrode 22 and collector electrode 23 fused and alloyed to opposed faces thereof directly opposite one another. The die 21 has a recrystallized P-type region adjacent each of the electrodes due to the alloying with the indium making up the electrodes. Thus, PN junctions are formed adjacent both electrodes between the alloyed region and the N-type germanium making up the die 21. The electrode 23 forming the collector is somewhat larger than the emitter electrode 22.

Fig. 4 illustrates apparatus used in preparing a subassembly composed of a plurality of semiconductor die units of the type illustrated in Figs. 2 and 3. Although the preparation of the germanium semiconductor material of itself forms no part of the present invention, it will be described briefly for the sake of completeness. A crystal of N-type germanium preferably having a relatively low resistivity of the order of 2 ohm-centimeters is cut into dice as by a thin diamond or silicon wheel. It is desirable that these wafers be formed to have their opposite faces parallel to the Miller (111) crystallographic planes.

The crystals are then lapped or otherwise mechanically ground, etched and cut into round discs having a diameter of about 0.14 inch and a thickness of fabout 0.007 inch. Round dice are preferred to rectangular ones since they are somewhat easier to cut.

The indium electrodes are formed in any suitable manner as by punching discs out of a thin indium sheet. In accordance with a specific embodiment of the present invention, the emitter disc 22 is of the order of 0.04 inch in diameter and 0.013 inch thick while the collector disc 23 is of the same thickness and has a diameter of about 0.06 inch. The indium electrodes are then cleaned by etching as in a mixture of nitric and hydrofluoric acids and are ready to be fixed to the germanium dice.

Fig. 2 shows a portion of a subassembly 24 which includes a series of circular dice 21 affixed to an elongated strip member 25. The strip 25 includes straight tab connector portions 20 and spaced-apart annular portions 26 with openings 27. The tab portions 20 extend tangentially from the annular portions 26. The strip 25 is preferably composed of nickel with a layer of tin laminated thereon. As shown in Figs. 2 and 3, a semiconductor die 21 is attached to the strip with emitter electrode 22 extending into opening 27. The strip forms a low ohmic base contact with the emitter face of the germanium crystal. Since connection is made to annular portion 26 along the circumference of the die 21, the base resistance of the unit is desirably low.

The subassembly 24 is formed by simultaneously fusing a series of dice 21 to strip 25 while alloying discs 22 and 23 to opposed base of each die. This is done by using the supporting boat or jig shown in Fig. 4. The boat or jig provides a completely enclosed space for each of the indium discs during the fusion process, so that they are moded when in their molten state and caused to wet a relatively large area on each surface of the germanium wafer. This produces large area, low penetration alloy regions which are desired for high or medium power transistors. Also, the electrodes are thin and have flat outer surfaces so that heat is conducted readily therethrough. The indium discs are pressed by the jig against the face of the die 21 during the alloying operation. The jig or boat shown in Fig. 3 includes a pair of blocks 30 and 31 composed, for example, of graphite or other heat resistive and non-wetting material. The top surface of block 30 has two rows of depressions 32 cut therein each of which accommodates an annular portion 26 of strip 25 and a semiconductor die 21 placed thereon. Although two rows of three pockets each are shown in Fig. 4, it is to be understood that as many as desired can be formed on the face of block 30. Each of the pockets or depressions 32 has a centrally disposed pit 33 formed in its bottom and these pits have the dimensions of the emitter discs which are supported therein. A central channel 34 is formed in the top surface of the block 30 between the two rows of pockets 32 and is wide enough so that a pair of strips 25 can be placed side by side on block 31.

The surface of block 31 has a series of pits 35 formed therein which correspond in diameter and depth to the collector disc 23. The block 31 is supported over block 30 and precisely aligned by locating pins 36 projecting from block 30 (at either end of the block, only one end being shown in Fig. 4) and which extend into holes 37 in block 31. This assures that the pits 35 will be directly over the pits 33 to enable the collector and emitter discs to be supported directly opposite to one another on opposed faces of the dice 21. The blocks are then held together by suitable screws extending through the screw holes 38.

A series of emitter discs are placed in the pits 33 and a pair of strips 25 placed in channel 34 with annular portion 26 fitting into depressions 32. A series of dice 21 are then placed on strip 25 with the dice fitting over openings 27 and in contact with annular portions 26. A series of collector discs are placed in pits 35 of block 31 and the two blocks fastened together with the wafers in contact with the strip 25 and the indium discs 22 and 23. The boat is placed in a horizontal position in a heating zone such as an argon atmosphere furnace. This causes the indium discs to melt and alloy with the opposite sides of the die and also causes the annular portions of the strips to be fused to one of the faces of the die. During the melting of the indium discs, the molten indium is held flat against the surface of the corresponding dice by the pits 33 and 35 for large area wetting. The boat or jig holds the outer surface of the electrode flat and keeps the electrodes desirably thin.

As previously noted, the melting of the indium discs causes the adjacent regions of the germanium crystal to become molten and to absorb a quantity of the indium so that, upon recrystallization, a pair of alloyed regions of the P-type conductivity are formed within the crystal with respective PN junctions between each region and the base region. This fusion is carried out at a temperature of about 1060°–1120° F. for a time interval of about 23 minutes.

After the subassembly 24 has been removed from the heating zone and allowed to cool, it is removed from the boat and has the form shown in Fig. 2 with the periphery of each die 21 fused to the annular portions of the strip and each of the dice having electrodes 22 and 23 fused thereto. The subassembly 24 is then subjected to a chemical treatment which consists of dipping it in a solution of nitric and hydrofluoric acids which etches and cleans the indium electrodes and also cleans and removes extraneous matter from the exposed surfaces of the semiconductor wafers. The subassembly is then washed in distilled water and air dried.

The subassembly 24 is composed of a number of individual semiconductor die units 19 each including a die fused to a base connector 28 which connector has extending tab 20 and annular portion 26. Base connector tab 20 is connected to die 21 through annular portion 26. Individual semiconductor die units 19 may be separated from the subassembly 24 by severing the tab portion 20 at appropriate locations. Thus, an individual semiconductor die unit may have the tab portion 20 extending from either side of the annular portion 26 (i.e. either to the right or the left as the assembly is shown in Fig. 2) depending on the orientation desired in mounting of the unit. The individual semiconductor die units 19 may either be individually separated prior to their being incorporated into transistors or separation from the subassembly may be made as the terminal unit of a subassembly is connected to the appropriate parts of a transistor assembly.

In assembly of the transistor itself, strap members 17 and 18 are first attached to upright leads 14 and 15 respectively. As shown in Fig. 5, the outer legs 17*a* and 18*a* of the straps are aligned with the parallel electrode leads 14 and 15 respectively and secured thereto as by welding. The surfaces of inner legs 17*b* and 18*b* are provided with projections 47 and 48 respectively. The straps 17 and 18 are so aligned that projections 47 and 48 are directly opposite one another. Straps 17 and 18 are made of a conductive metal having good heat transfer characteristics and are silver in accordance with a specific embodiment of the invention. The straps are relatively wide to present a maximum surface area for the dissipation of heat which they conduct away from the collector and emitter junctions of the transistors. The folded configuration of the straps provides a greater area for transferring heat to the oil or other medium within the transistor cover than if the straps connecting the semiconductor die to mounting leads were simply straight pieces. Since the straps are folded, the heat transfer members can be confined within a smaller cover than if straight flat strips of the same area were employed.

As shown in Fig. 7, a semiconductor unit 19 which has been separated from the assembly 24 is inserted between the inner legs 17*b* and 18*b* of the conductive straps and with collector electrode 23 in contact with projection 47 and emitter electrode 22 in contact with projection 48. The straps 17 and 18 are of sufficient resilience to exert an inward pressure to insure good contact between the projections and the electrodes. The base connector 20 tab is placed against the base lead 16 extending through the mounting base and spot welded to the lead. With the indium electrodes in contact with the projections 47 and 48 on the surfaces of the legs 17*b* and 18*b*, heat is applied locally to the straps in an inert atmosphere until the indium melts and fuses to the projections. The inner legs are thus fixed in electrical connection and heat exchange relation one with each electrode. Connection between the various parts of a semiconductor unit 19 and the straps and base lead may be established while unit 19 is still integral with subassembly 24 and separation subsequently made by severing strip 20 at the appropriate place.

As indicated in Fig. 1 the leads 14, 15 and 16 are arranged to form the apexes of a triangle. Because of the round shape of the mounting base 11, the maximum spacing between the leads can be provided with the minimum area. Thus, the interelectrode capacitance of the unit can be controlled while the overall size need not be increased.

The unit is then ready for electrical testing. In the great majority of cases, failure of a unit to meet electrical specifications is due to an imperfection in the semiconductor die unit 19 rather than in the mounting base 11. In accordance with the present invention, a defective semiconductor unit 19 can be separated from the mounting base 11 by scraping the soft indium from the projections 47 and 48, pulling back in inner legs of straps 17 and 18 and clipping the base lead 16 below the point where it is attached to the base connector tab 20. Base lead 16 is initially of such length that it can conveniently be shortened in this way at least twice and still be usable as a transistor lead to have a die unit mounted on it. The mounting base which is the most expensive single part of the transistor can now be reused with other semi-conductor die units.

With the base lead 16 shortened, a new semiconductor unit 19*a* can be mounted with the base connector tab 20 toward the mounting base 11, in the position shown in Fig. 8. The unit 19*a* has its tab portion 20 extending from its annular portion 26 in the direction opposite from the tab portion of unit 19. This permits unit 19*a* to be aligned as shown with its electrodes in contact with the appropriate projections. Because the electrodes of the die unit 19*a* are centrally located thereon, it can be used in the position shown in Fig. 8 and the electrodes will be in the same position relative to the projections of the straps as were the electrodes of the die unit mounted as shown in Fig. 6. In the event this unit also fails electrical tests the defective die may again be removed and a third unit substituted.

Prior to making the substitution the base lead 16 is still further shortened by clipping it off below the point at which unit 19*a* has been attached. Then the third unit 19*b* is mounted in the position shown in Fig. 9 with the base connector tab 20 parallel to the base lead. Mounting in this position is possible because the tab portion 20 is sufficiently wide to extend to the base lead 17 with the electrodes aligned between projections 47 and 48.

The construction which permits the base member to be employed with three different semiconductor die units in the event there should be electrical failures of the first or second units, provides important assembly and cost advantages, and insures a better operating product when it has been accepted on the electrical test.

The structure and method of handling by which three different semiconductor units can be successively used in the same mounting base if the transistor fails to pass the electrical tests on the first or the second assemblies is an important feature of the invention. This is a fact because transistor production has not as yet advanced to a position where rejects are small in number, or the finished units are so low in cost that they can be thrown away without any serious economic results. But, the possibility of using successive units does not mean that this is the normal experience with the unit of the present invention. Actually, the structure and method of assembly provides a high order of satisfactory units on the initial production and test. However, if there is a failure, the entire unit does not have to be thrown away, as is the case of the many semiconductor devices being manufactured at the present time.

After the unit has passed the electrical test it is ready for enclosure. This may be done by turning the unit upside down with the leads pointing upwardly and lowering it into the cover member 42 which contains a predetermined amount of special heat conducting fluid such as a silicone oil. The cover 42 is then affixed to the annular lip portion 11*a* of the mounting base as by welding.

Fig. 10 illustrates an M-shaped clip 40 from which, in accordance with one embodiment of the invention, conductive straps 17 and 18 are formed. In accordance with this embodiment, the clip 40 is secured to mounting base 11 with its outer legs connected to electrode leads 14 and 15. The web portion 41 connecting the two sides of the M is cut away to separate the clip 40 into folded straps 17 and 18. A semiconductor die unit 19 is then positioned between the inner legs 17*b* and 18*b* with the electrodes of the semiconductor die unit resting in contact with the inner surfaces of the strap legs and with its tab portion against the base lead. The spacing between the inner legs is such that the desired contact is established. Heat is applied locally to soften the electrodes and cause them to fuse to the surface of the contiguous straps.

The advantage of cutting the folded straps 17 and 18 from the same integral piece such as the clip 40 after the clip has been attached to the electrode leads is that automatic alignment of the straps directly opposite one another is thereby facilitated. Although the clip 40 illustrated in Fig. 10 is shown without projections formed on its inner legs it will be understood that suitable projections, corresponding in position and function to projections 47 and 48, may be provided in connection with this embodiment of the invention.

The present invention thus provides a unique transistor structure including a pair of folded strap members providing for effective dissipation of heat. These effective heat dissipating members can be confined in a relatively small volume because of their configuration and can be easily aligned in assembling the transistor. The unique construction of the transistor also permits reuse of the expensive base member after it has been separated from a semiconductor die unit which has failed to meet electrical specifications thus effecting desirable manufacturing economies.

We claim:

1. In a transistor having a mounting base with an insulating portion therein, the combination including collector, emitter and base leads held in said insulating portion and extending through and above said mounting base, with said base lead extending farther above said mounting base than the other leads and adapted to provide a plurality of alternate surface portions to which to secure a replacement die unit upon rejection of a die unit secured thereto, a pair of electrically conductive folded straps, one each connected to said collector and emitter leads, and a semiconductor die unit positioned between said straps, said die unit including a one-piece flat base connector, a semiconductor die having a collector electrode and an emitter electrode on opposite faces thereof with each of said electrodes connected to an adjacent strap, with said one-piece flat base connector having an extending tab portion secured to said base lead so that said base connector is in a horizontal position relative to said mounting base, and with said base connector being of a configuration and size so that it may be aligned parallel to said base lead in one alternate position with its extending tab portion secured to said base lead in a new surface connection, the alignment of said electrodes with said folded straps being the same in said alternate position.

2. In a transistor of a construction whereby a defective semiconductor die unit can be removed from the mounting base thereof to salvage the mounting base for reuse with another die unit, the combination including a mounting base having an interiorly located insulating portion, a metal portion around the same to which to secure a metal cover, three post-like leads extending through said insulating portion in a direction at right angles to the insulating portion and insulated from one another and from said metal portion, with one of said post-like leads being of such a length in one direction at right angles away from the insulating portion that it can be reduced in length by cutting it at least twice to provide a new fastening surface after cutting while still remaining of such length after each cut that it is usable as a transistor post-like lead to which to fasten a metal tab, a semiconductor material die unit including a semiconductor die having electrode portions in rectifying connection thereon and including a stamped one-piece flat metal table with an enlarged portion supporting said die thereon in ohmic connection therewith, said one-piece flat metal tab having an elongated integral portion mechanically and conductively connected to said one post-like lead and being fastenable on said one post-like lead at any one of its said lengths, and conductor means between each of said remaining two post-like leads and an electrode portion corresponding to such a lead.

3. In a transistor having a semiconductor material die unit with a collector electrode and an emitter electrode thereon, the combination of a mounting base assembly having an insulating portion, metallic means around said insulating portion to which to secure a metal cover to close said transistor, a collector post-like lead, an emitter post-like lead, and a base post-like lead each extending through said insulating portion and each said lead supported therein in spaced apart and insulated relation from one another, a single metallic member having an enlarged portion electrically connected to and supporting said die unit with said electrodes thereon and having an integral elongated portion extending in a horizontal direction relative to the top of the mounting base assembly and being narrower than said enlarged portion, with said elongated portion of said single metallic member being electrically connected adjacent one end to said base lead, a pair of vertically positioned U-shaped contact members for said collector and said emitter electrodes respectively, each of which contact members has one leg secured to an electrode and the other leg to its corresponding post-like lead, and a metal cover secured to said metallic means and effecting a closure therewith entirely around said transistor.

4. In a transistor of a construction adapted for salvage of the mounting base thereof when it has a defective semiconductor die assembly and having a semiconductor die assembly with collector and emitter electrodes and adapted for large area base connection at the outside edge thereof, the combination of a mounting base having a central insulating portion with three post-leads extending therethrough and insulated from one another for base, emitter, and collector electrode connections respectively, and with said base lead being of such a length initially that it can be successively cut upon removal of a rejected semiconductor die assembly from the transistor for replacement by an acceptable die assembly in an alternate position along said base lead, a single flat metallic member having an enlarged portion supporting said die assembly thereon in ohmic connection therewith and having an elongated portion extending from said enlarged portion and narrower than the same, with said elongated portion being fastenable to said base lead in any one of its lengths, and contact means between said two electrodes and the corresponding leads on the base.

5. A method of manufacturing a transistor to initially assemble the same and to salvage a portion thereof and reassemble a transistor when a portion of the initial assembly is defective, said method including the providing of a mounting base having a plurality of metal posts insulatingly retained therein, providing a semiconductor die unit which has a flat metal mounting member apertured in one portion and has a semiconductor die secured to the mounting member at the aperture with one electrode thereon extending through said aperture and another electrode oppositely disposed thereon, providing a contact member on each of two metal posts and positioned so that such members accommodate the semiconductor die unit therebetween, securing said semiconductor die unit mounting member at one end thereof to a third metal post, securing said contact members to their respective die unit electrodes, testing said complete assembly and upon finding a defective semiconductor die unit removing said semiconductor die unit from the assembly, positioning a second semiconductor die unit between said contact members on the corresponding metal posts with the electrodes on the die unit centered relative to said contact members and with one end of the die unit mounting member at the third metal post but positioned at a surface portion thereof not used in the previous assembly, securing the mounting member to said third metal post at said surface portion and the die unit electrodes to the corresponding contact members, testing said assembly, and applying a cover to the mounting base.

6. In a transistor of a construction adapted for salvage of the mounting base thereof when it has a defective semiconductor die unit, the combination of a mounting base having three leads extending therethrough and insulated from one another, said leads projecting from one side of said mounting base forming base, emitter and collector posts, a die and mount assembly comprising a semiconductor die unit having a base portion and collector and emitter portions on opposite sides of said base portion, and a metallic mounting member having an enlarged portion supporting said die unit thereon in ohmic connection with said base portion and having an elongated portion narrower than said enlarged portion extending from said enlarged portion to said base post and connected thereto, and a pair of contact members respectively connected to said collector and emitter posts, said contact members having spaced contact portions positioned to receive said die unit between the same with said collector and emitter portions being aligned with said spaced contact portions and secured thereto, said base post and said elongated portion of said mounting member respectively being of such lengths initially that upon rejection of said semiconductor die unit, said die and mount assembly can be removed from the transistor and the base post can be shortened to accommodate mounting a replacement die and mount assembly of the same construction by placing the die unit thereof between said contact members with the collector and emitter portions aligned with said contact portions, and by fastening the elongated portion of the replacement metallic member to the shortened base post and securing the collector and emitter portions to the contact portions.

7. In a transistor of a construction adapted for salvage of the mounting base thereof when it has a defective semiconductor die unit, the combination of a mounting base having three leads extending therethrough and insulated from one another, said leads projecting from one side of said mounting base forming base, emitter and collector posts, a die and mount assembly comprising a semiconductor die unit having a base portion and collector and emitter portions on opposite sides of said base portion, and a metallic mounting member having a first portion supporting said die unit thereon in ohmic connection with said base portion and having an elongated second portion extending from said first portion to said base post and connected thereto, and a pair of contact members respectively connected to said collector and emitter posts, said contact members having spaced contact portions positioned to receive said die unit between the same with said collector and emitter portions being aligned with said spaced contact portion and secured thereto, said elongated portion of said mounting member being off-set laterally from said die unit and being of a length such that said mounting member can have alternate positions in which said die unit is between said contact members with said collector and emitter portions in alignment with said spaced contact portions and with said elongated portion extending to different surface portions of said base post, and said base post being of such a length initially that upon rejection of said semiconductor die unit, said die and mount assembly can be removed from the transistor and replaced by another die and mount assembly of the same construction by placing the replacement mounting member in a different one of said alternate positions than originally used and by securing the collector and emitter portions of the replacement die unit to said spaced contact portions and securing the elongated portion of the replacement mounting member to a different surface portion of said base post than that originally used.

8. A method of manufacturing a transistor to initially assemble the same and to salvage a portion thereof and reassemble a transistor when a portion of the initial assembly is defective, said method comprising, providing a mounting base having a plurality of leads retained therein which form connector posts projecting from one side of said base, providing a die and mount subassembly which includes a semiconductor die unit with emitter, collector and base portions and which also includes a metallic mounting member having an enlarged portion supporting the die unit in ohmic connection with the base portion thereof and having an elongated portion extending from the enlarged portion, providing contact members respectively on two of the connector posts and positioned so that the contact members receive the semiconductor die unit therebetween, securing said elongated portion of said mounting member at one end thereof to a third connector post, securing said contact members to said collector and emitter portions of said die unit, testing the resulting assembly and upon finding a defective semiconductor die unit removing said die and mount subassembly therefrom, positioning a second such die and mount subassembly with the die unit thereof between said contact members and with the elongated portion of the mounting member extending to the third post but positioned at a surface portion thereof not used in the previous assembly, securing said elongated portion to said third post at said surface portion and securing said contact members to the collector and emitter portions of the die unit, testing the resulting assembly, and applying a cover to the mounting base.

References Cited in the file of this patent

UNITED STATES PATENTS

| | | |
|---|---|---|
| 2,830,920 | Colson et al. | Apr. 15, 1958 |
| 2,882,462 | Zierdt | Apr. 14, 1959 |

FOREIGN PATENTS

| | | |
|---|---|---|
| 771,039 | Great Britain | Mar. 27, 1957 |